(12) United States Patent
Kojima

(10) Patent No.: US 10,885,955 B2
(45) Date of Patent: Jan. 5, 2021

(54) DRIVER CIRCUIT EQUIPPED WITH POWER GATING CIRCUIT

(71) Applicant: MICRON TECHNOLOGY, INC., Boise, ID (US)

(72) Inventor: Mieko Kojima, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/374,613

(22) Filed: Apr. 3, 2019

(65) Prior Publication Data

US 2020/0321038 A1 Oct. 8, 2020

(51) Int. Cl.
| | | |
|---|---|---|
| G11C 7/10 | (2006.01) | |
| H01L 27/108 | (2006.01) | |
| G11C 11/409 | (2006.01) | |
| G11C 7/22 | (2006.01) | |

(52) U.S. Cl.
CPC ............ *G11C 7/1096* (2013.01); *G11C 7/222* (2013.01); *G11C 11/409* (2013.01); *H01L 27/108* (2013.01)

(58) Field of Classification Search
CPC ....... G11C 8/12; G11C 11/1675; G11C 16/24; G11C 7/00
See application file for complete search history.

(56) References Cited

U.S. PATENT DOCUMENTS

| | | | |
|---|---|---|---|
| 8,325,511 B2 | 12/2012 | Seshadri | |
| 2008/0158934 A1* | 7/2008 | Kang | G11C 11/22 365/145 |
| 2008/0285367 A1 | 11/2008 | Jung et al. | |
| 2009/0010054 A1* | 1/2009 | Kang | G11C 11/22 365/182 |
| 2009/0207642 A1* | 8/2009 | Shimano | G11C 11/405 365/72 |
| 2011/0110176 A1 | 5/2011 | Lee et al. | |
| 2011/0205785 A1* | 8/2011 | Nagatsuka | G11C 8/08 365/149 |
| 2012/0099383 A1* | 4/2012 | Kim | G11C 7/1057 365/189.02 |
| 2013/0141961 A1 | 6/2013 | Matsuzaki | |
| 2017/0040350 A1 | 2/2017 | Yamazaki et al. | |

OTHER PUBLICATIONS

ISR/WO dated Jul. 17, 2020 for PCT Application No. PCT/US2020/026250, 11 pgs.

* cited by examiner

*Primary Examiner* — Tuan T Nguyen
(74) *Attorney, Agent, or Firm* — Dorsey & Whitney LLP

(57) ABSTRACT

Disclosed herein is an apparatus that includes a rust buffer circuit, a plurality of first driver circuits configured to drive the first buffer circuit, and a plurality of first switch circuits configured to supply an operation voltage to the first driver circuits, respectively. The first driver circuits are collectively arranged in a first region in a matrix, and the first switch circuits are collectively arranged in a second region different from the first region.

16 Claims, 17 Drawing Sheets

DRIVER CIRCUIT EQUIPPED WITH POWER GATING CIRCUIT

BACKGROUND

A semiconductor device such as a DRAM (Dynamic Random-Access Memory) drives read data read from a memory cell array using an output buffer, and outputs the data to outside via data terminals. A plurality of driver circuits that drive the output buffer are provided at the preceding stage of the output buffer. In order to reduce an off-leakage current, there is a case where a switch circuit is provided in each of these driver circuits between sources of transistors constituting the driver circuit and a power supply line. However, when many driver circuits are arranged in an array, there is a problem as to where the switch circuit is to be placed.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient dead to enable those skilled in the art to practice the present invention. Other embodiments may be utilized, and structural, logical and electrical changes may be made without departing from the scope of the present invention. Hereinafter, a layout or a layout diagram may be defined to show a physical arrangement of circuits and/or circuits of blocks which is different from a logical diagram. The various embodiments disclosed herein are not necessarily mutually exclusive, as some disclosed embodiments can be combined with one or more other disclosed embodiments to form new embodiments.

Figure 1:
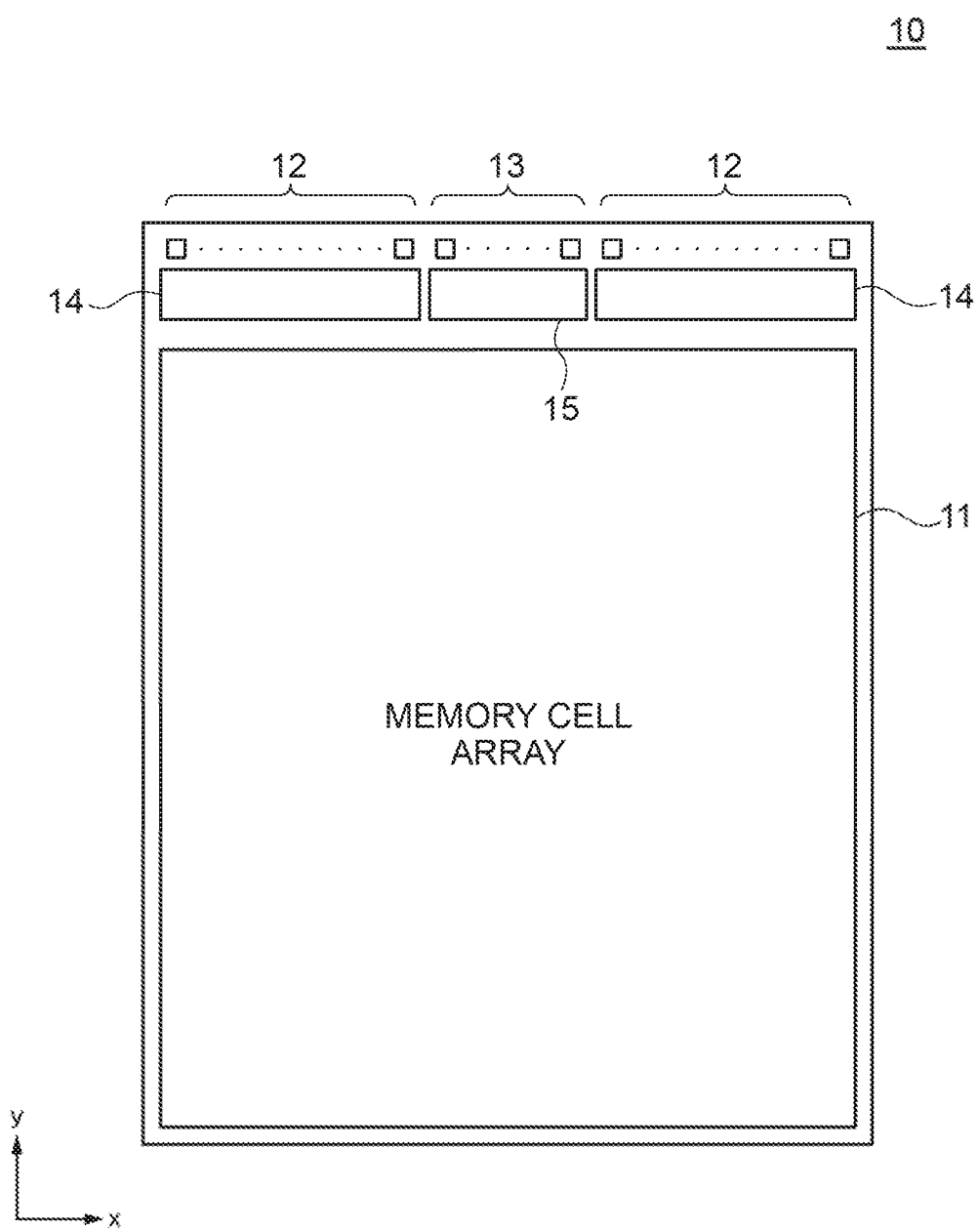
FIG. 1 is a schematic plan view showing a layout of a semiconductor device according to the present disclosure.

A semiconductor device 10 according to the present disclosure is an LPDDR5 (Low-Power Double Data Rate 5) DRAM and has a memory cell array 11, a plurality of data terminals 12, and a plurality of command address terminals 13 as shown in FIG. 1. The terminals 12 and 13 are arranged along one side extending in an x direction of the semiconductor device 10. There are also other terminals such as power terminals. The data terminals 12 are arranged in two separate locations and the command address terminals 13 are arranged therebetween. The memory cell array 11 and the data terminals 12 are connected via an I/O control circuit 14, and the memory cell array 11 and the command address terminals 13 are connected via an access control circuit 15. When read commands and address signals corresponding thereto are input from the command address terminals 13, read data that are read from the memory cell array 11 are output to the data terminals 12 via the I/O control circuit 14. When write commands and address signals corresponding thereto are input from the command address terminals 13, write data that are input to the data terminals 12 are written to the memory cell array 11 via the I/O control circuit 14.

Figure 2:
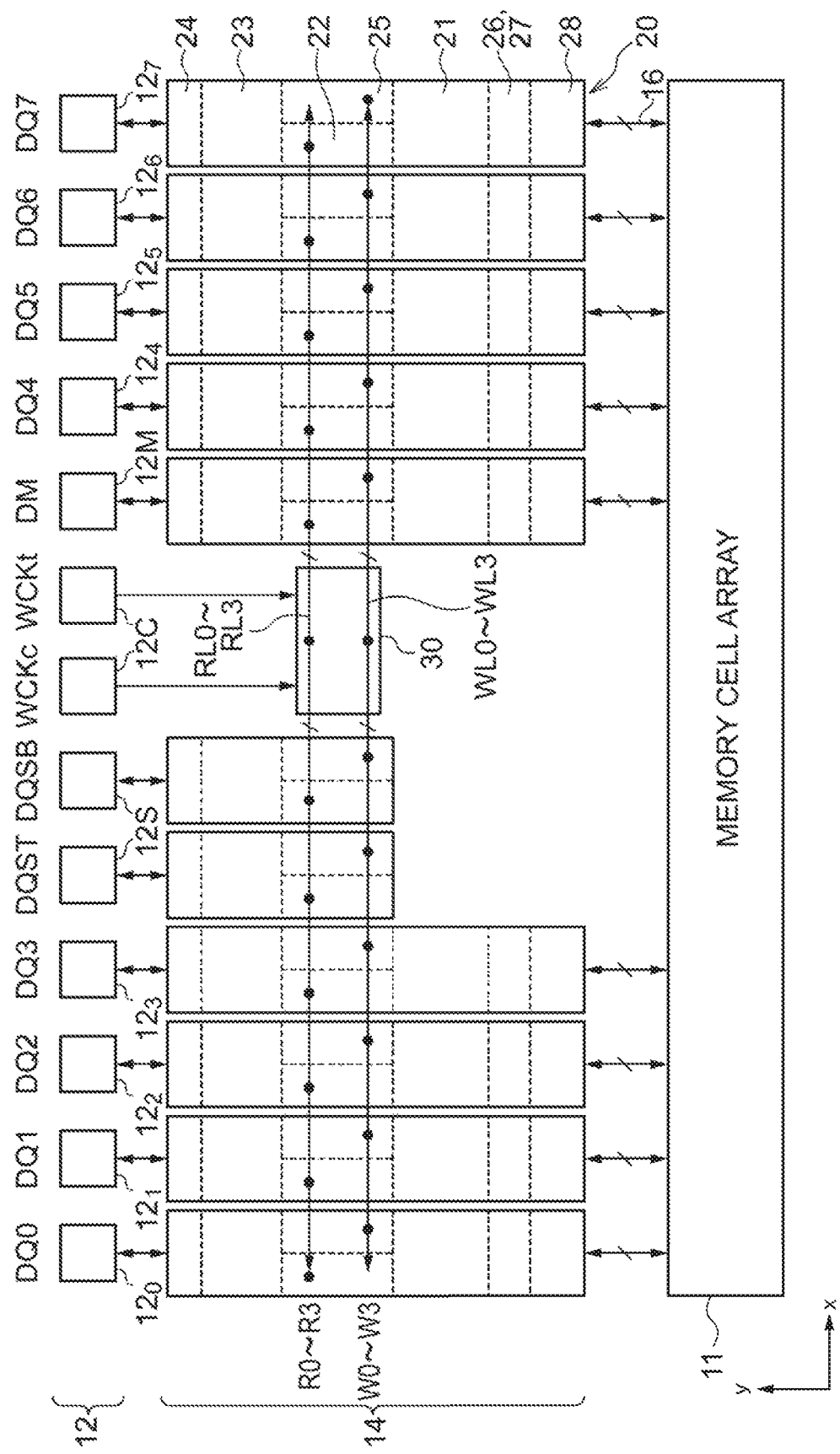
FIG. 2 is a layout diagram showing a configuration of I/O control circuits.

As shown in FIG. 2, the data terminals 12 include terminals $12_0$ to $12_7$, to and from which data DQ0 to DQ7 are input and output, respectively, a terminal 12M to and from which a data mask signal is input and output, terminals 12S to and from which complementary strobe signals DQST and DQSB are input and output, respectively, and terminals 12C to which complementary clock signals WCKt and WCKc are input, respectively. I/O control circuits 20 are respectively allocated to the terminals $12_0$ to $12_7$ and 12M. The I/O control circuits 20 are connected to the memory cell array 11 via read/write buses 16. The I/O control circuits 20 include a read system circuit including a read data storage circuit 21, a read clock synchronization circuit (a parallel to serial conversion circuit) 22, a driver circuit 23, and an output buffer 24, and a write system circuit including an input buffer 25, a timing adjustment circuit 26, a write clock synchronization circuit (a serial to parallel conversion circuit) 27, and a write data output circuit 28. The I/O control circuits 20 arranged in a y direction according to the x coordinates of corresponding ones of the data terminals 12, respectively, to enable read data and write data to flow in the y direction.

Figure 3:
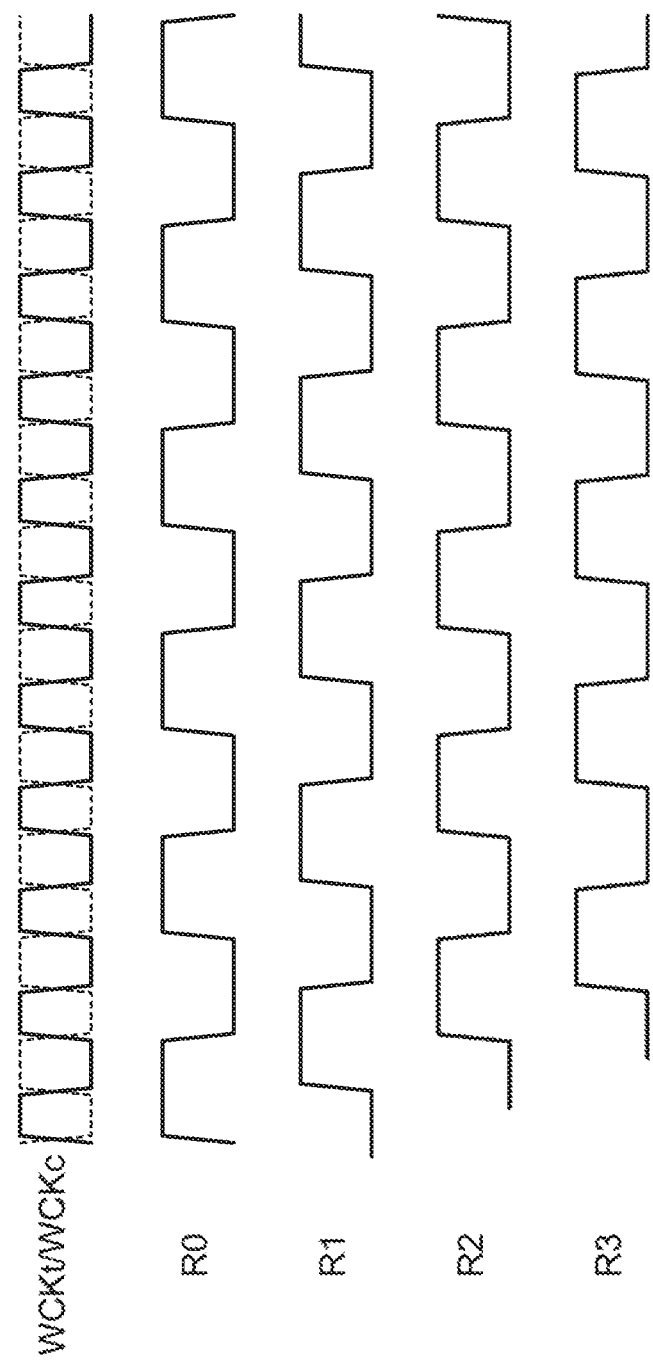
FIG. 3 is a waveform diagram of read clock signals.

The clock signals WCKt and WCKc are input to a clock signal generation circuit 30. The clock signal generation circuit 30 generates read clock signals R0 to R3 and write clock signals W0 to W3 on the basis of the clock signals WCKt and WCKc. As shown in FIG. 3, the read clock signals R0 to R3 are four-phase clock signals having a period twice as long as that of the clock signals WCKt and WCKc and are different in phase from one another by 90 degrees. The read clock signals R0 to R3 are supplied to the read clock synchronization circuit 22 via read clock lines RL0 to RL3, respectively. The read clock synchronization circuit 22 performs a parallel to serial conversion operation of read data in synchronization with the read clock signals R0 to R3. The write clock signals W0 to W3 are different in phase from one another by 90 degrees and are supplied to the input buffer 25 via write clock lines WL0 to WL3, respectively. The input buffer 25 performs a serial to parallel conversion operation of write data in synchronization with the write clock signals W0 to W3. The read clock lines RU) to R13 and the write clock lines WL0 to WL3 all extend in the x direction.

Figure 4:
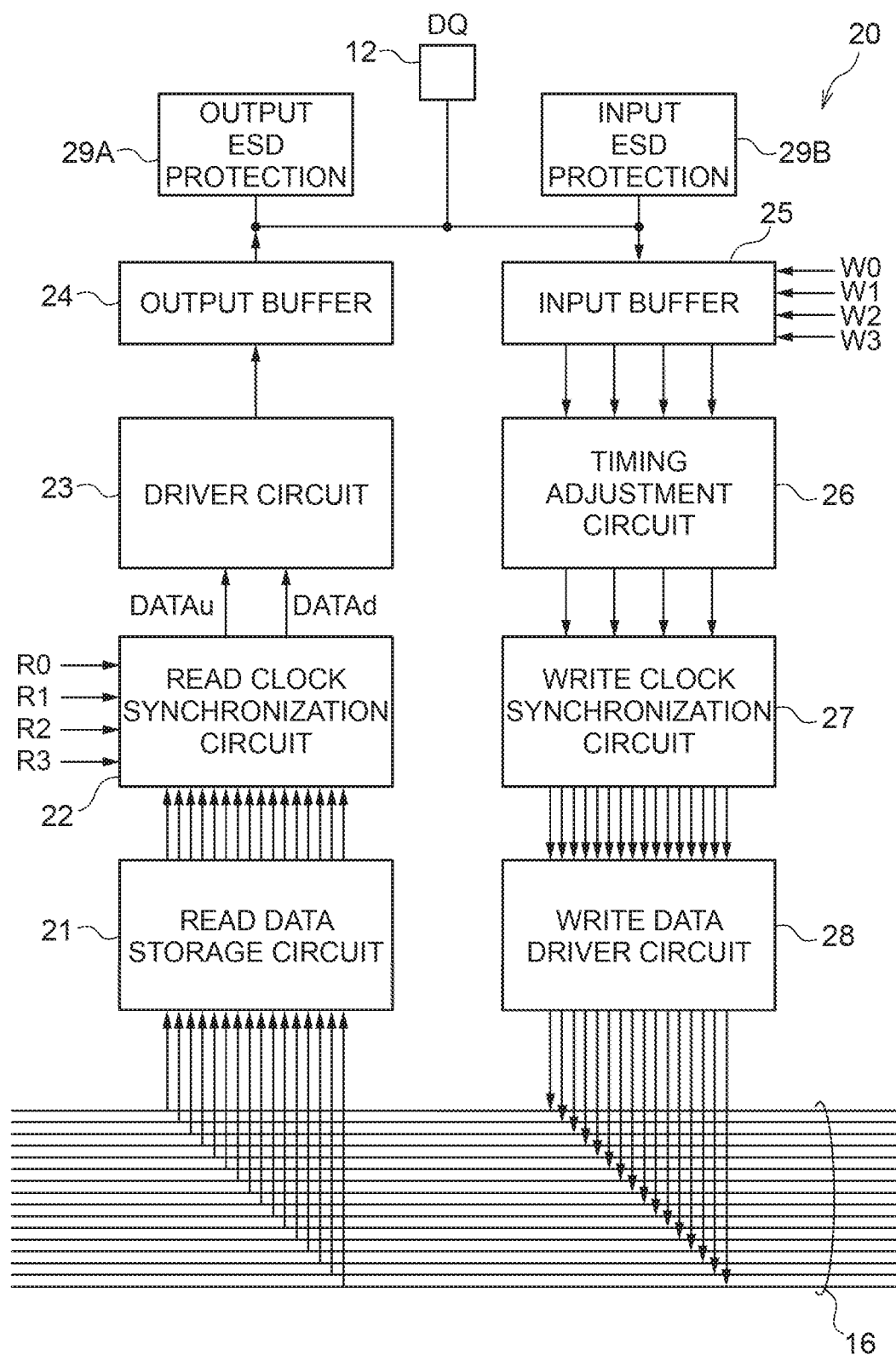
FIG. 4 is a block diagram showing a configuration of the I/O control circuits.

FIG. 4 is a block diagram showing a configuration of the I/O control circuits 20. The read data storage circuit 21, the read clock synchronization circuit 22, the driver circuit 23, and the output buffer 24 constitute the read system circuit and are connected in this order between the read/write buses 16 and the data terminals 12. An output ESD (electrostatic discharge) protection circuit 29A is provided near the output buffer 24. The input buffer 25, the timing adjustment circuit 26, the write clock synchronization circuit 27, and the write data output circuit 28 constitute the write system circuit and are connected in this order between the data terminals 12 and the read/write buses 16. An input ESD protection circuit 29B is provided near the input buffer 25.

The read data storage circuit 21 stores therein parallel read data supplied from the read/write buses 16 and supplies the read data to the read clock synchronization circuit 22. The read clock synchronization circuit 22 converts the parallel read data into serial data on the basis of the read clock signals R0 to R3 to generate complementary pull-up data DATAu and pull-down data DATAd. The driver circuit 23 drives the output buffer 24 on the basis of the pull-up data DATAu and the pull-down data DATAd, whereby serial write data DQ is output from the data terminals 12. The impedance, the driver strength, and the slew rate of the output buffer 24 are adjusted by the driver circuit 23.

Figure 5:
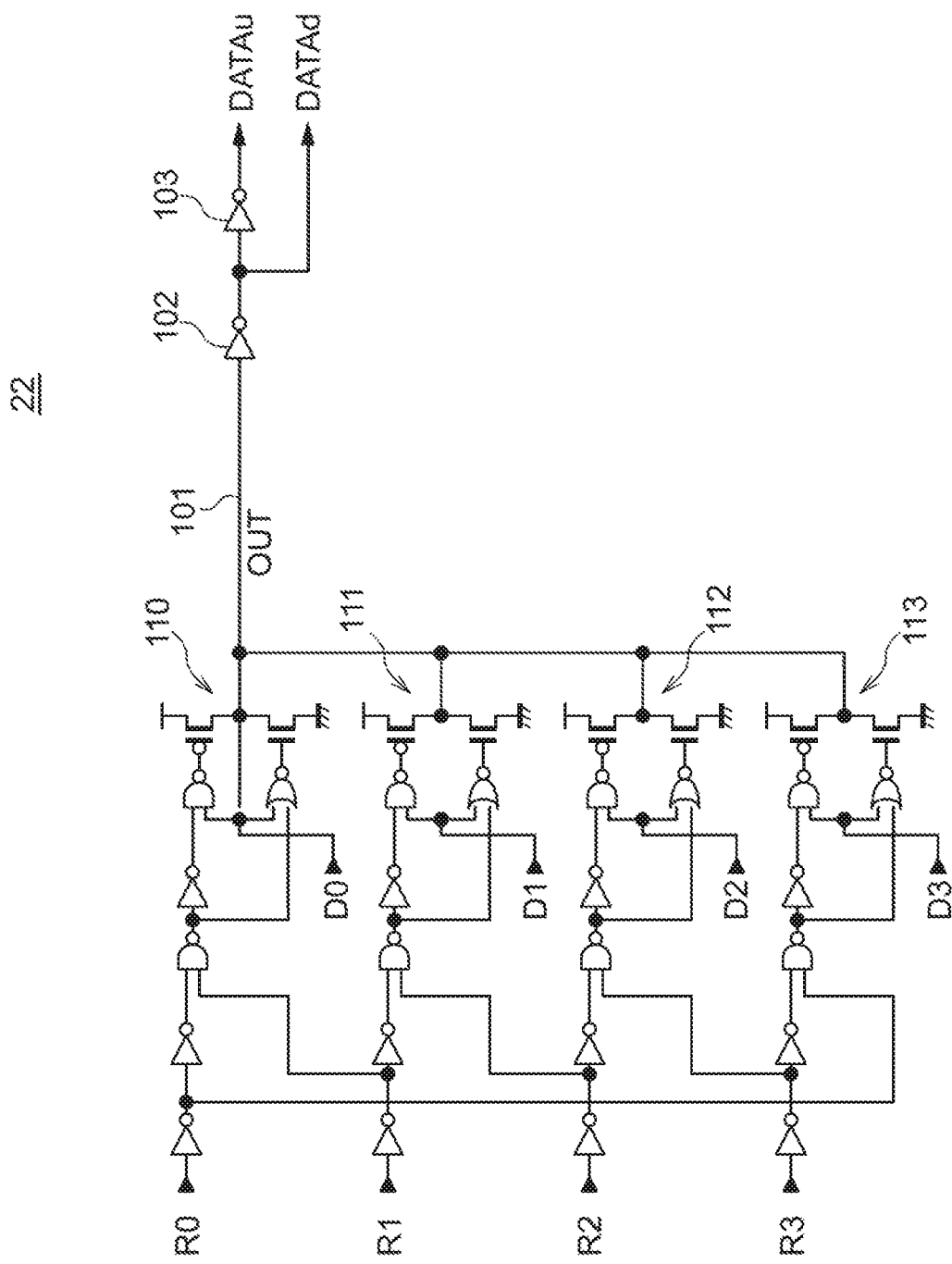
FIG. 5 is a circuit diagram showing a configuration of relevant parts of a read clock synchronization circuit.
Figure 6:
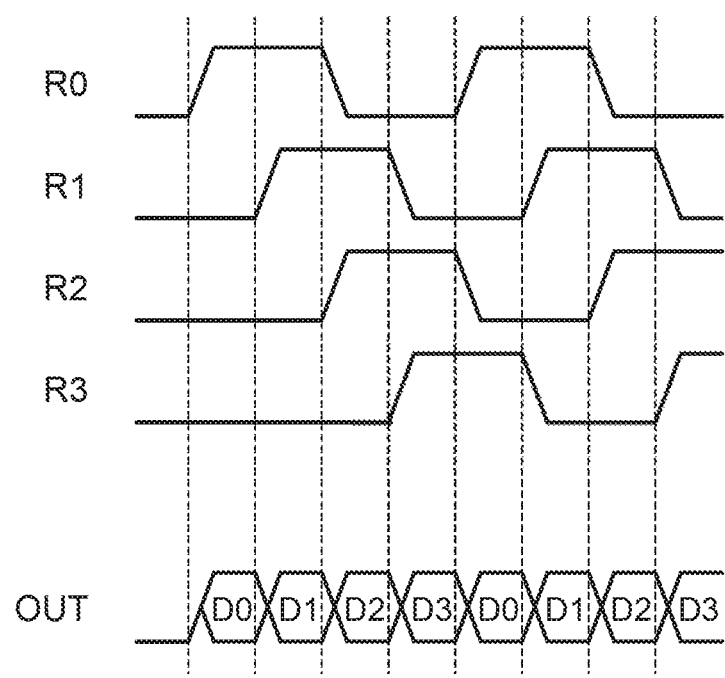
FIG. 6 is a timing diagram for explaining an operation of the read clock synchronization circuit.

FIG. 5 is a circuit diagram showing a configuration of relevant parts of the read clock synchronization circuit 22. As shown in FIG. 5, the read clock synchronization circuit 22 has four tristate buffer circuits 110 to 113. One of the tristate buffer circuits 110 to 113 is activated and the remaining three tristate buffer circuits have outputs in a high impedance state on the basis of the read clock signals R0 to R3. Output nodes of the tristate buffer circuits 110 to 113 are connected to a signal node 101 in co on. The read clock signals R0 to R3 are four-phase clock signals different in phase from one another by 90 degrees as shown in FIG. 6. The tristate buffer circuits 110 to 113 output read data D0 to D3 to the signal node 101 in response to rising edges of the read clock signals R0 to R3, respectively. Therefore, the frequency of the serial read data D0 to D3 appearing on the signal node 101 is four times as high as the frequency of the parallel read data D0 to D3 input to the tristate buffer circuits 110 to 113, respectively.

Figure 7:
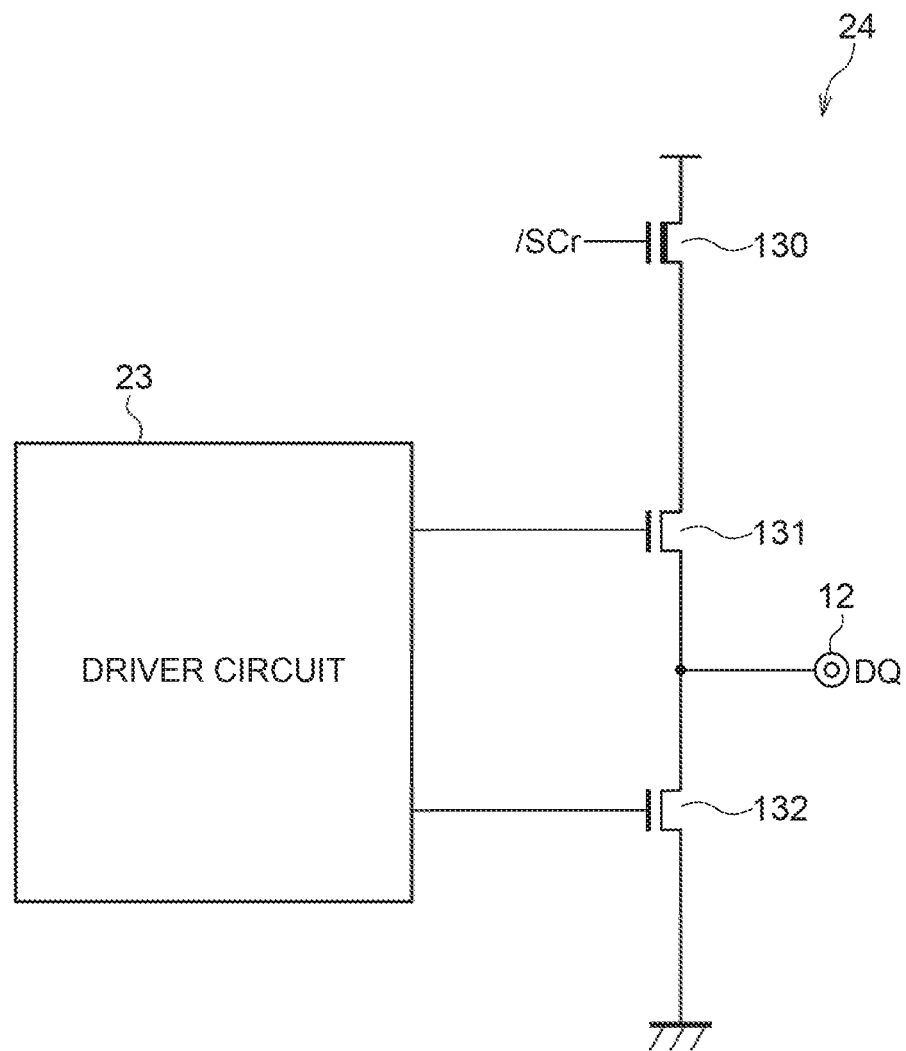
FIG. 7 is a circuit diagram of an output buffer.

Inverter circuits 102 and 103 are cascade-connected at the subsequent stage of the signal node 101. The output of the inverter circuit 103 is used as the pull-up data DATAu and the output of the inverter circuit 102 is used as the pull-down data DATAd. The pull-up data DATAu and the pull-down data DATAd are supplied to the driver circuit 23. The driver circuit 23 is a circuit that drives the output buffer 24. As shown in FIG. 7, the output buffer 24 includes a switch transistor 130, an output transistor 131, and an output transistor 132 connected in series. The switch transistor 130 is an N-channel MOS transistor having a thickened gate dielectric film, and a reset signal/SCr is supplied to agate electrode thereof. The reset signal/SCr becomes a high level at the time of a read operation. The output transistors 131 and 132 are N-channel MOS transistors and gate electrodes thereof are driven by the driver circuit 23.

Figure 8:
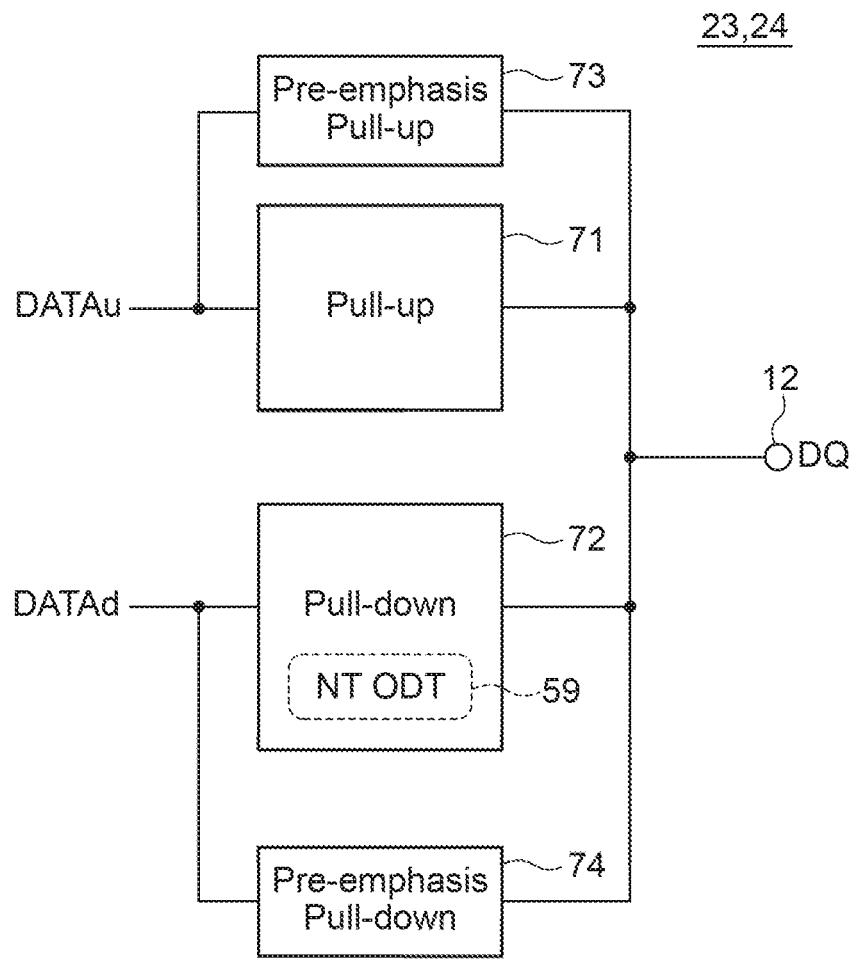
FIG. 8 is a circuit block of a driver circuit and an output buffer corresponding to one data terminal.
Figure 9:
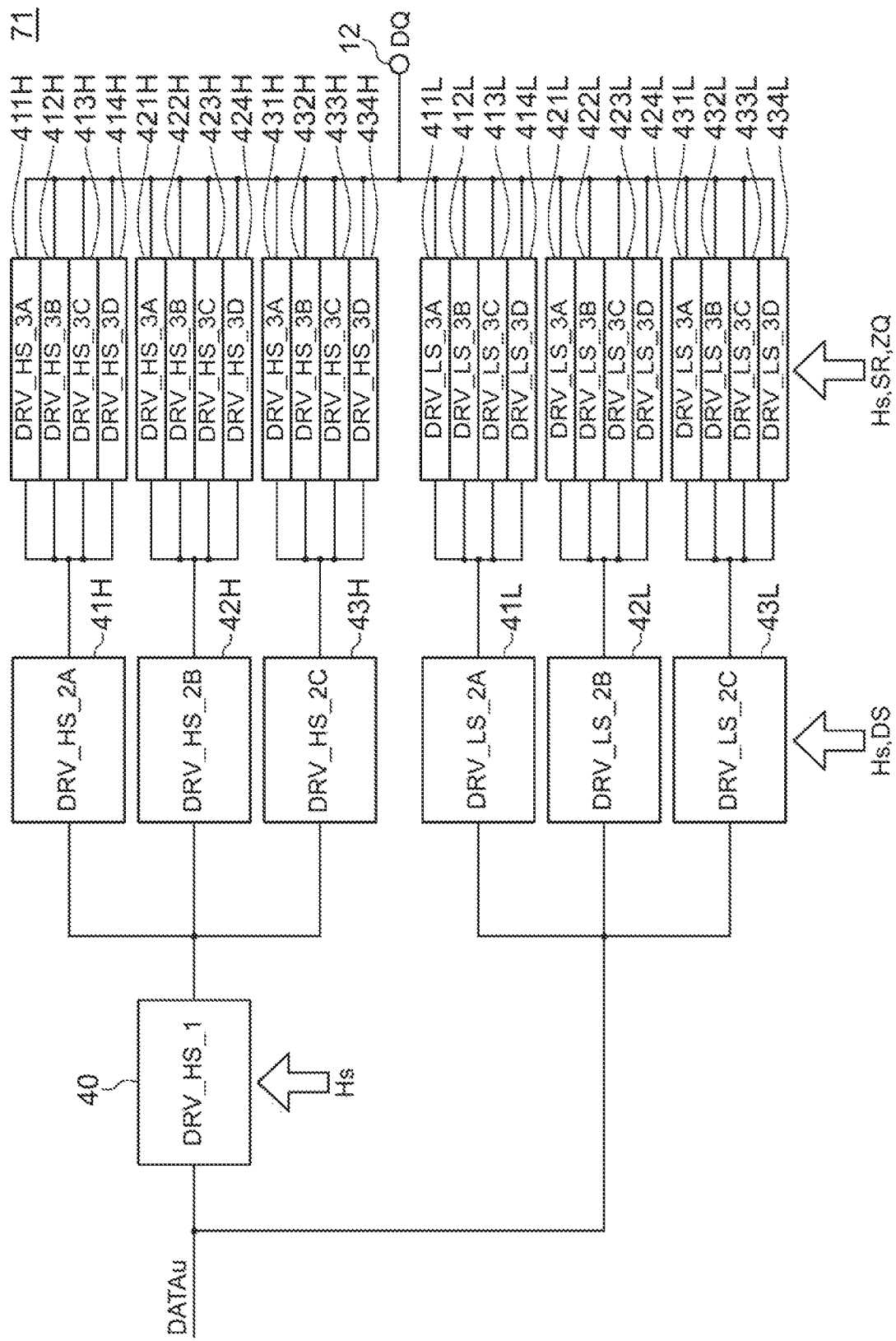
FIG. 9 is a block diagram showing a configuration of a pull-up circuit.

FIG. 8 is a circuit block of the driver circuit 23 and the output buffer 24 corresponding to one data terminal 12. As shown in FIG. 8, the pull-up data DATAu is supplied to a pull-up circuit 71 and a pre-emphasis circuit 73. The pull-up circuit 71 is activated at the time of a pull-up operation, that is, when high-level read data DQ is to be output from the data terminal 12. The pull-up circuit 71 has three speed selectors 41H to 43H belonging to a high-speed path, and three speed selectors 41L to 43L belonging to a low-speed path as shown in FIG. 9. As to whether the high-speed path or the low-speed path is to be used is selected by a speed mode signal Hs input to a driver circuit 40. When the high-speed path is selected, one of the speed selectors 41H to 43H or two or more thereof are selected on the basis of a driver strength selection signal. When the low-speed path is selected, one of the speed selectors 41L to 43L or two or more thereof are selected on the basis of the driver strength selection signal. The driver sizes of the speed selectors 41H to 43H can differ from one another. Similarly, the driver sizes of the speed selectors 41L to 43L can differ from one another. The speed selectors 41H, 42H, 43H, 41L, 42L, and 43L have pull-up driver circuits 411H to 414H, 421H to 424, 431H to 434H, 411L to 414L, 421L to 424L, and 431L to 434L, respectively. These pull-up driver circuits 411H to 44H, 421H to 424H, 431H to 434H, 411L to 414L, 421L to 424L, and 431L to 434L are circuits that equally selectively drive adjustment MOS transistors respectively included in a plurality of output-stage circuits that have equal impedances, so as to correct the impedance for each of the output-stage circuits to a desired value on the basis of an impedance selection signal ZQ. The numbers of output-stage circuits handled by the speed selectors 41H/L to 43H/L differ from one another. For example, the circuit 41H/L handles three output-stage circuits, the circuit 42H/L handles two output-stage circuits, and the circuit 43H/L handles one output-stage circuit. In this case, the pull-up driver circuits 411H to 414H or 411L to 414L in the circuit 41H/L each drive the adjustment MOS transistors corresponding to three output-stage circuits, the pull-up driver circuits 421H to 424H or 421L to 424L in the circuit 42H/L each drive the adjustment MOS transistors corresponding to two output-stage circuits, and the pull-up driver circuits 431H to 434H or 431L to 434L in the circuit 43H/L each drive the adjustment MOS transistors corresponding to one output-stage circuit. Accordingly, the output impedance at the time of a pull-up operation can be selected with an accurate impedance at a desired driver strength. The speed mode signal Hs and a slew rate selection signal SR are also supplied to the pull-up driver circuits in common.

Figure 10:
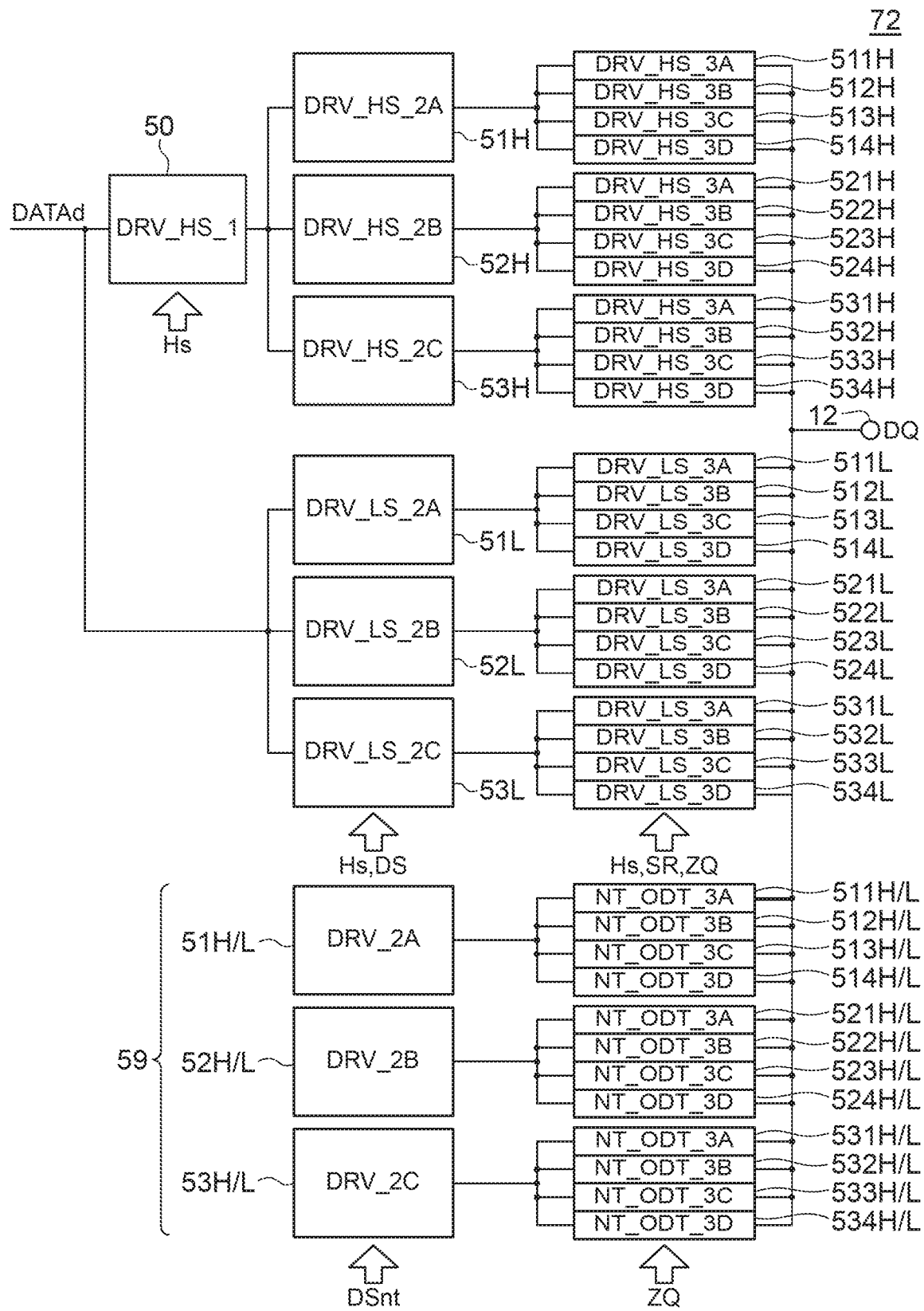
FIG. 10 is a block diagram showing a configuration of a pull-down circuit.

The pull-down data DATAd is supplied to a pull-down circuit 72 and a pre-emphasis circuit 74. The pull-down circuit 72 is activated at the time of a pull-down operation, that is, when low-level read data DQ is to be output from the data terminal 12. When a non-target ODT (on-die termination) operation is performed, a driver circuit 59 included in the pull-down circuit 72 is activated. As shown in FIG. 10, the pull-down circuit 72 has three speed selectors 5tH to 53H belonging to the high-speed path, and three speed selectors 51L to 53L belonging to the low-speed path. FIG. 10 also shows the driver circuit 59 that performs the non-target ODT operation. As to whether the high-speed path or the low-speed path is to be used is selected by the speed mode signal Hs input to a driver circuit 50. When the high-speed path is selected, one of the speed selectors 51H to 53H or two or more thereof are selected on the basis of the driver strength selection signal. When the low-speed path is selected, one of the speed selectors 51L to 53L or two or more thereof are selected on the basis of the driver strength selection signal. The driver sizes of the speed selectors 5H to 53H can differ from one another. Similarly, the driver sizes of the speed selectors 51L to 53L can differ from one another. The speed selectors 51H, 52H, 53H, 51L, 52L, and 53L have pull-down driver circuits 511H to 514H, 521H to 524H 531H to 534H, 51L to 14L, 521L to 524L, and 531L to 534L, respectively. These pull-down driver circuits 511H to 514H, 521H to 524H, 531H to 534H, 511L to 514L, 521L to 524L, and 531L to 534L are circuits that equally selectively drive adjustment MOS transistors respectively included in a plurality of output-stage circuits that have equal impedances, so as to correct the impedance for each of the output-stage circuits to a desired value on the basis of the impedance selection signal ZQ. The numbers of output-stage circuits handled by the speed selectors 51H/L to 53H/L differ from one another. For example, the circuit 51/L handles three output-stage circuits, the circuit 52H/L handles two output-stage circuits, and the circuit 53H/L handles one output-stage circuit. In this case, the pull-down driver circuits 511H to 514H or 511L to 514L in the circuit 51H/L each drive the adjustment MOS transistors corresponding to three output-stage circuits, the pull-down driver circuits 521H to 524H or 521L to 524L in the circuit 52H/L each drive the adjustment MOS transistors corresponding to two output-stage circuits, and the pull-down driver circuits 531H to 534H or 531L to 534L in the circuit 53H/L each drive the adjustment MOS transistors corresponding to one output-stage circuit. Accordingly, the output impedance at the time of a pull-down operation can be selected with an accurate impedance at a desired driver strength. The speed mode signal Hs and the slew rate selection signal SR are also supplied to the pull-down driver circuits in common.

The pull-down circuit 72 includes the driver circuit 59 that performs the non-target ODT operation. The driver circuit 59 is constituted by parts of the speed selectors 51H/L to 53H/L and the pull-down driver circuits 511H/L to 514H/L, 521H/L to 524H/L, and 531H/L to 534H/L, and is activated regardless of the speed mode signal Hs when the non-target ODT operation is performed. As to which of the speed selectors 51H/L to 53H/L is to be activated at the time of the on-target ODT operation is selected by a driver strength selection signal DSnt dedicated for the non-target ODT operation. The impedances of the pull-down driver circuits 511H/L to 514H/L, 521H/L to 524H/L, and 531H/L to 534H/L at the time of the non-target ODT operation are designated by the impedance selection signal ZQ.

The pre-emphasis circuits 73 and 74 serve a function to compensate skin resistance loss or dielectric loss occurring at the time of a high-frequency operation, by temporarily lowering the output resistance only during a period where data is transitioned. Accordingly, data can be transitioned at an appropriate slew rate also at the time of a high-frequency operation, and the data terminals 12 can be driven with a set resistance in a steady state.

Figure 11:
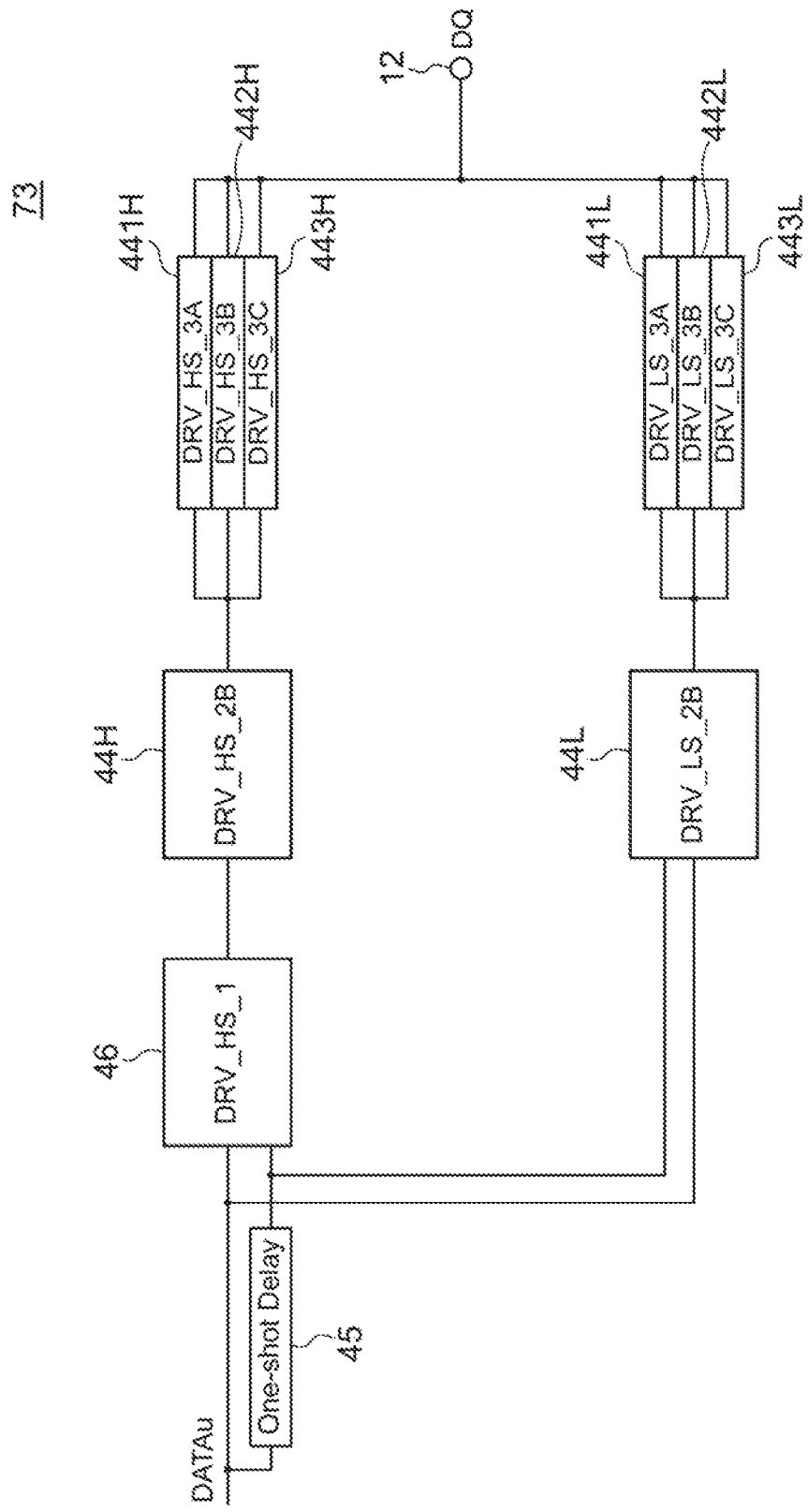
FIG. 11 is a block diagram showing a configuration of a pull-up pre-emphasis circuit.

The pre-emphasis circuit 73 is activated to steepen the rising edge of the read data DQ when the read data DQ is transitioned to a high level. As shown in FIG. 11, the pre-emphasis circuit 73 has a one-shot pulse generation circuit 45, speed selectors 44H and 46 belonging to the high-speed path, and a speed selector 44L belonging to the low-speed path. The speed selector 44H controls three pull-up driver circuits 441H to 443H and the speed selector 44L controls three pull-up driver circuits 441L to 443L.

Figure 12:
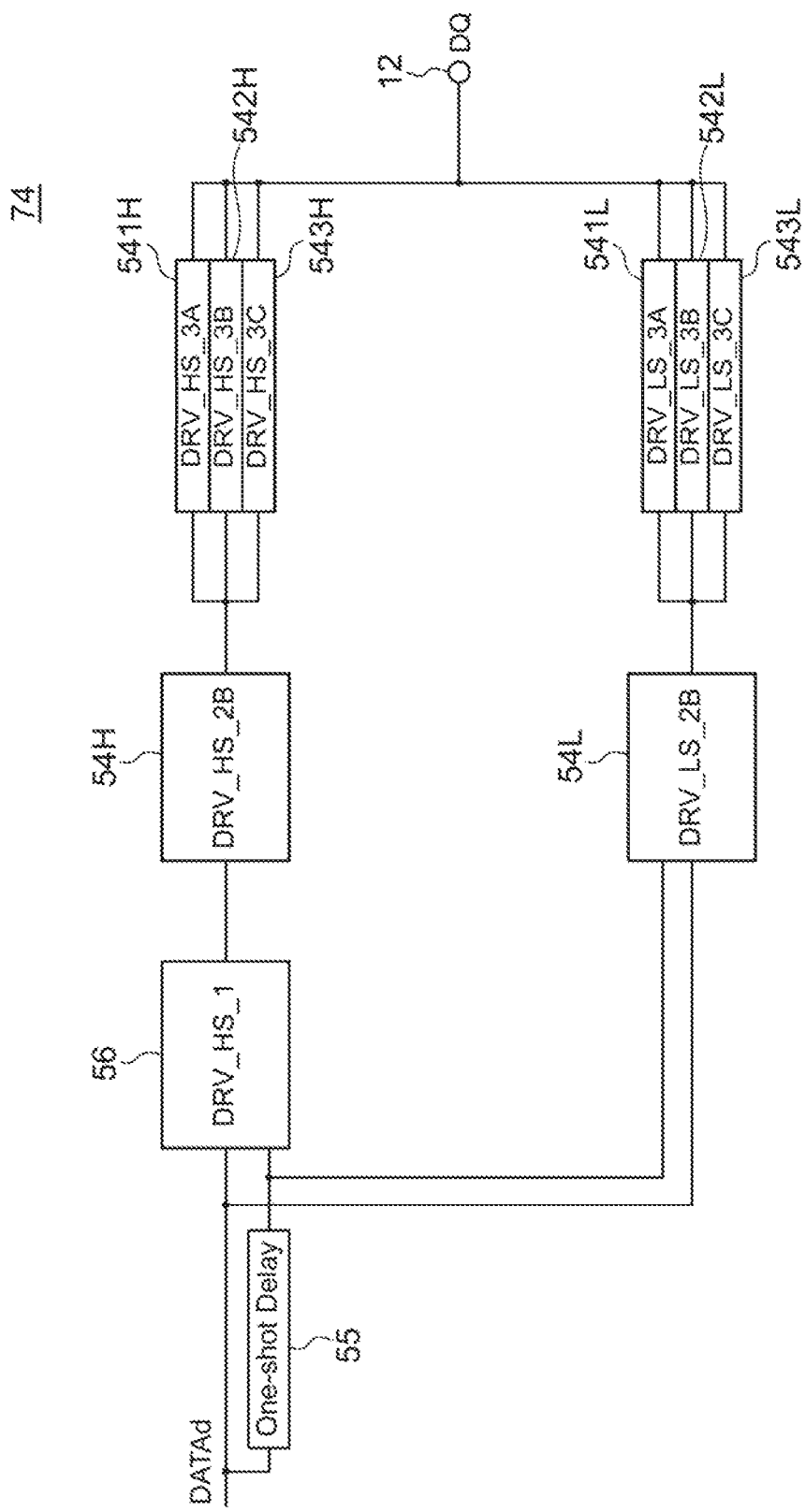
FIG. 12 is a block diagram showing a configuration of a pull-down pre-emphasis circuit.

The pre-emphasis circuit 74 is activated to steepen the falling edge of the read data DQ when the read data DQ is transitioned to a low level. As shown in FIG. 12, the pre-emphasis circuit 74 has a one-shot pulse generation circuit 55, speed selectors 54H and 56 belonging to the high-speed path, and a speed selector 54L belonging to the low-speed path. The speed selector 54H controls three pull-up driver circuits 541H to 543H and the speed selector 54L controls three pull-up driver circuits 541L to 543L.

Figure 13:
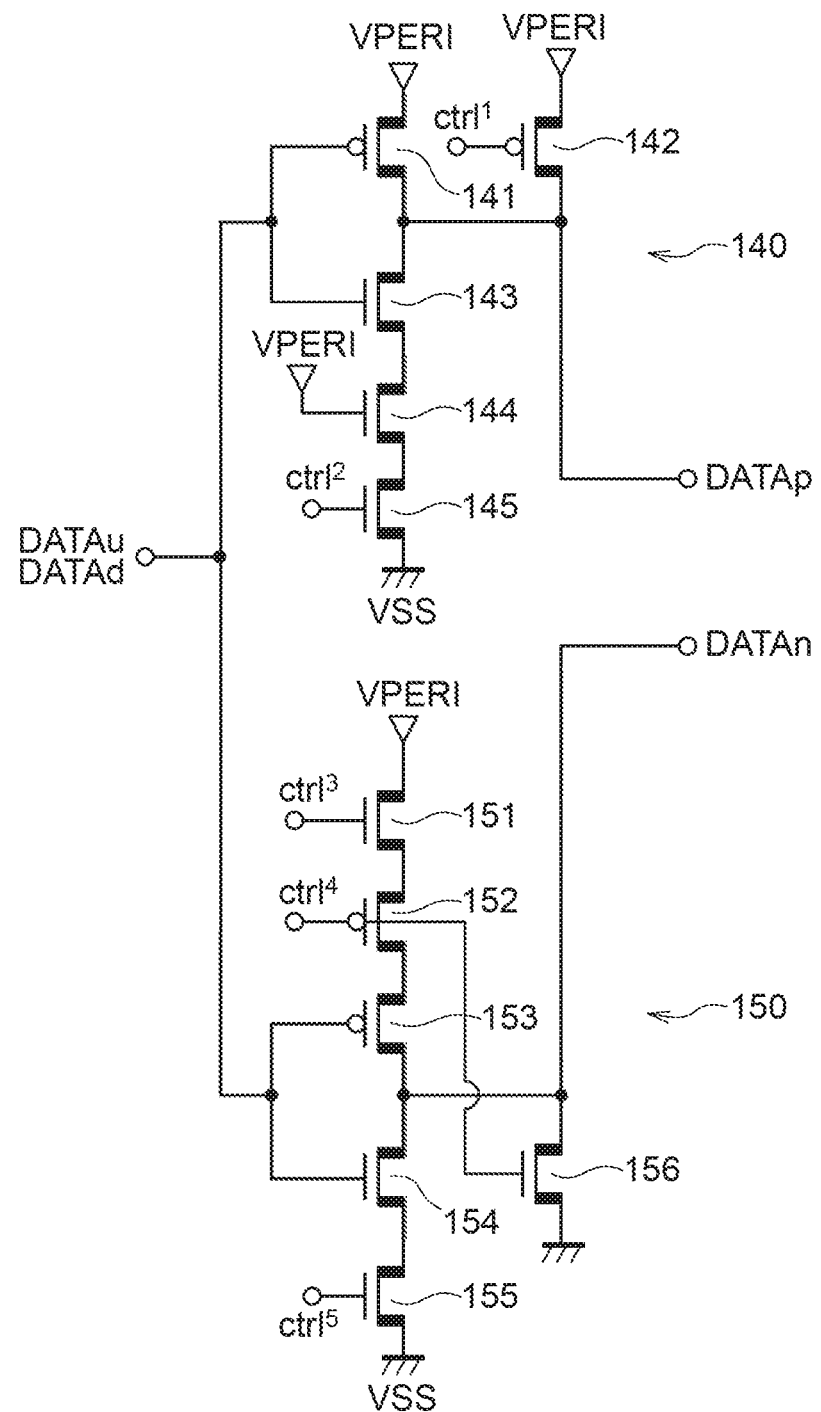
FIG. 13 is a circuit diagram of speed selectors.

FIG. 13 is a circuit diagram of the speed selectors. Each of the speed selectors includes a NAND gate circuit 140 and a NOR gate circuit 150. The NAND gate circuit 140 generates a data signal DATAp on the basis of the pull-up data DATAu or the pull-down data DATAd and control signals $ctrl^1$ and $ctrl^2$ High-speed transistors having a lowered threshold voltage are used as transistors 141 to 145 constituting the NAND gate circuit 140. The NOR gate circuit 150 generates a data signal DATAn on the basis of the pull-up data DATAu or the pull-down data DATAd and control signals $ctrl^3$ to $ctrl^5$. High-speed transistors having a lowered threshold voltage are used also as transistors 151 to 156 constituting the NOR gate circuit 150. The control signals $ctrl^1$ to $ctrl^5$ are a speed mode signal, a timing signal, a non-target ODT enable signal, or a signal obtained by a logic synthesis of these signals.

Figure 14:
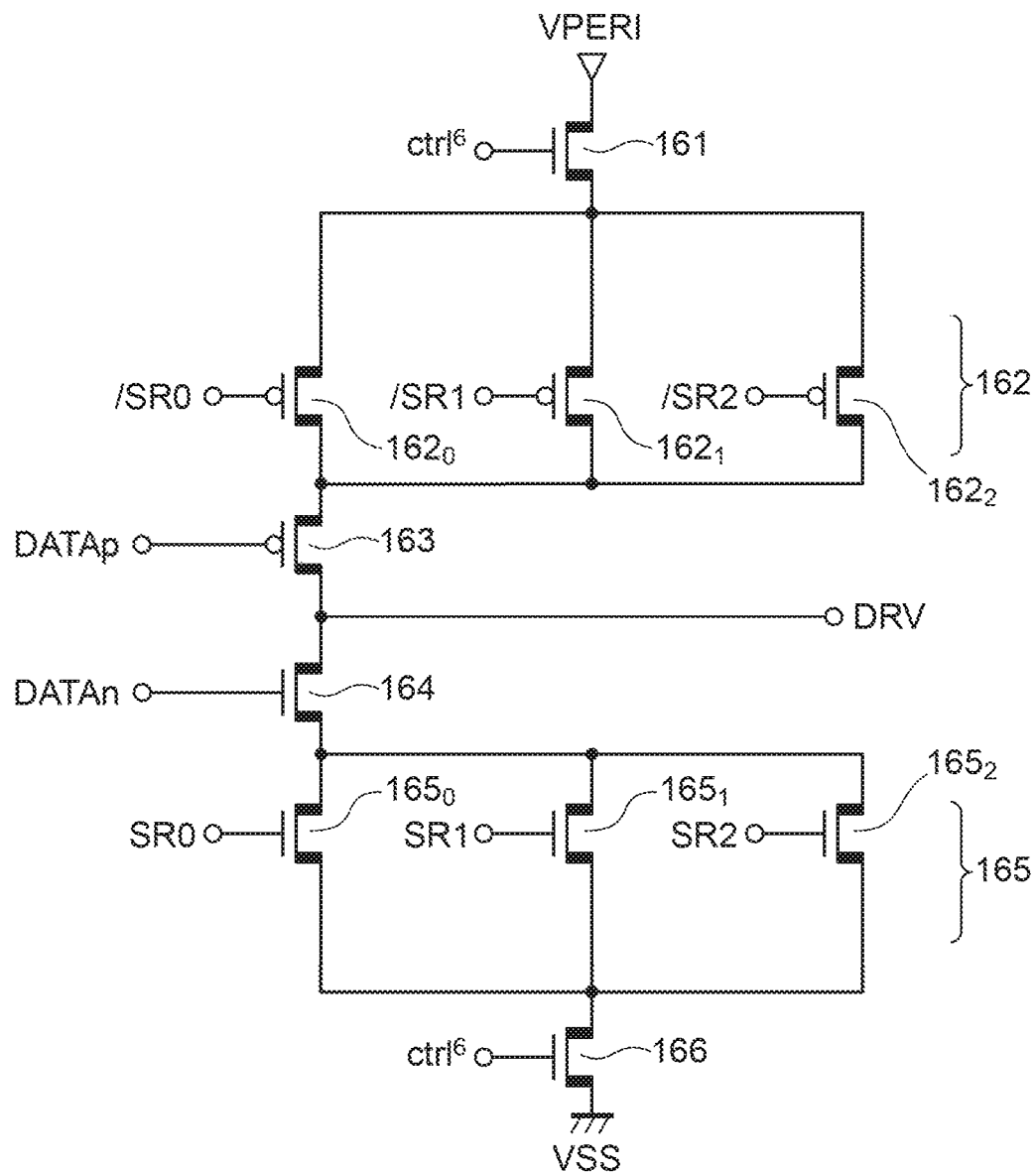
FIG. 14 is a circuit diagram of a pull-up driver or a pull-down driver.

FIG. 14 is a circuit diagram of the pull-up driver or the pull-down driver. The pull-up driver or the pull-down driver is a tristate buffer having transistors 161 to 166 connected in series, and a drive signal DRV is output from a connection point between the transistor 163 and the transistor 164. The data signal DATAp is supplied to a gate electrode of the transistor 163 and the data signal DATAn is supplied to a gate electrode of the transistor 164. The transistors 161 and 166 are transistors for activating the relevant pull-up driver or pull-down driver, and a control signal ctrl obtained by a logic synthesis of the speed mode signal and the timing signal is input to gate electrodes thereof. The transistors 161 and 166 can be high-voltage transistors having a thickened gate dielectric film. When the transistors 161 and 166 are turned OFF, the relevant pull-up driver or pull-down driver is deactivated and the output node thereof becomes a high impedance state. The transistor 162 is constituted by a plurality of transistors $162_0$ to $162_2$ connected in parallel and the transistor 165 is constituted by a plurality of transistors $165_0$ to $165_2$ connected in parallel. Inverted signals of bits SR0 to SR2 (e.g., SR0 to/SR2) constituting a slew rate code signal SR are supplied to gate electrodes of the transistors $162_0$ to $162_2$, respectively. The bits SR0 to SR2 constituting the slew rate code signal SR are supplied to gate electrodes of the transistors $165_0$ to $165_2$, respectively. The slew rate code signal SR can include impedance code information.

With this configuration, one of the transistors 131 and 132 constituting the output buffer 24 is turned ON on the basis of the pull-up data DATAu and the pull-down data DATAd and the read data DQ of a high level or a low level is output from the data terminals 12 at the time of a mad operation. On the other hand, at the time of a write operation, the write data DQ input to the data terminals 12 is supplied to the input buffer 25. The input buffer 25 converts the serial write data DQ into parallel four-bit write data DQ on the basis of the write clock signals W0 to W3. The timings of the parallel four-bit write data DQ are adjusted by the timing adjustment circuit 26. Thereafter, the parallel four-bit write data DQ are further converted into parallel 16-bit write data DQ by the write clock synchronization circuit 27 and are output to the read/write buses 16 via the write data output circuit 28.

Figure 15:
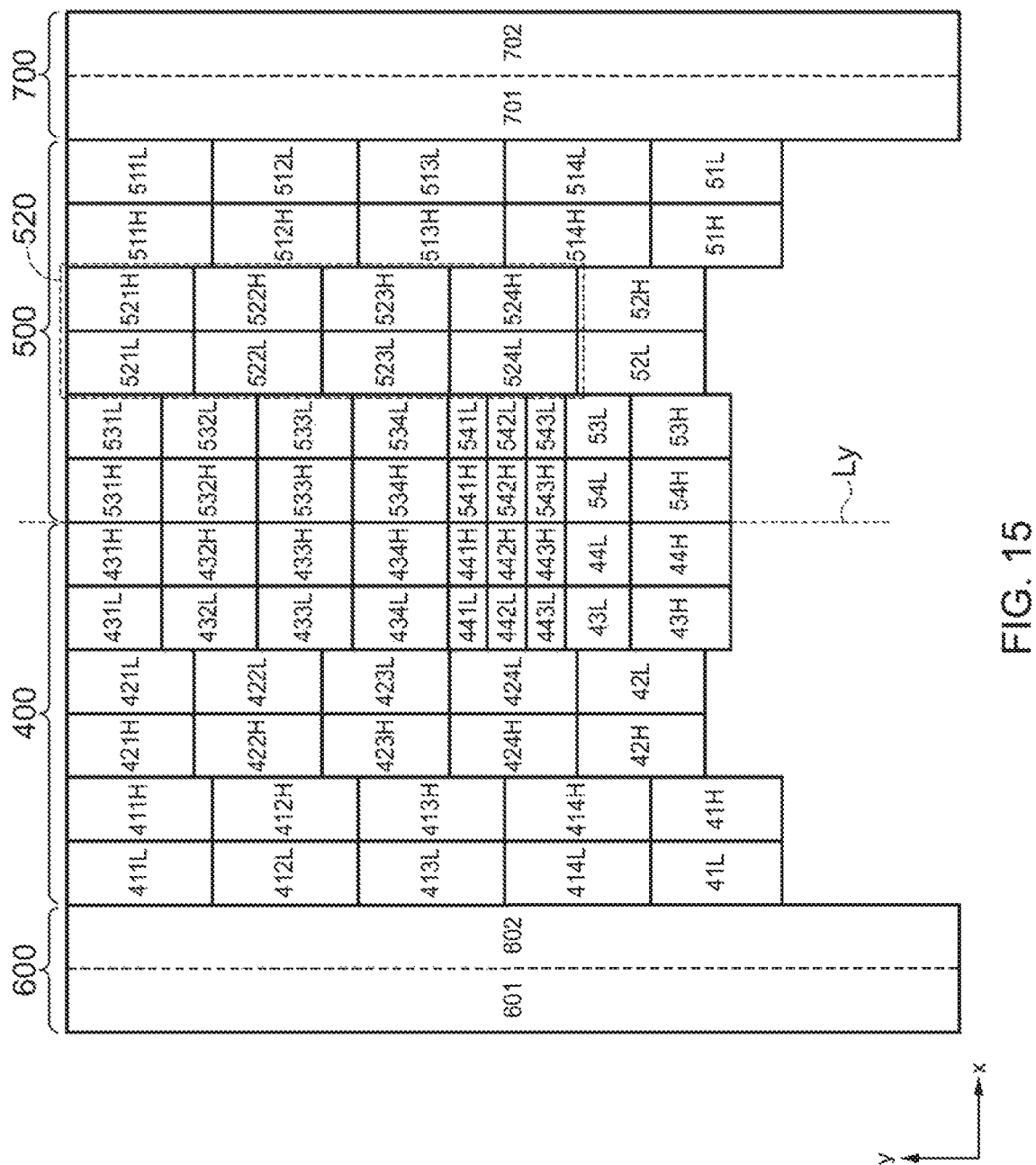
FIG. 15 is a layout diagram of the driver circuit.

FIG. 15 is a layout diagram of the driver circuit 23. As shown in FIG. 15, the speed selectors 41H to 44H and 41L to 44L and the pull-up driver circuits 411H to 414H, 421H to 424H, 431H to 434H, 441H to 444H, 411L to 414L, 421L to 424L, 431L to 434L, and 441L to 444L are collectively arranged in an array in a region 400, and the speed selectors 51H to 54H and 51L to 54L and the pull-down driver circuits 511H to 514H, 521H to 524H, 531H to 534H, 541H to 544H, 511 to 514L, 521L to 524L, 531L to 534L and 544L to 544L are collectively arranged in an array in a region 500. Among the transistors constituting the pull-up driver circuits, the transistors 161 and 166 shown in FIG. 14 are collectively arranged in a region 600 and are not arranged in the region 400. Similarly, among the transistors constituting the pull-down driver circuits, the transistors 161 and 166 shown in FIG. 14 are collectively arranged in a region 700 and are not arranged in the region 500. The regions 600, 400, 500, and 700 are arranged in this order in the x direction. The region 60 includes regions 601 and 602 arranged in the x direction. Ones of the transistors 161 and 166 constituting the pull-up driver circuits are collectively arranged in the region 601 and the others of the transistors 161 and 166 constituting the pull-up driver circuits are collectively arranged in the region 602. Similarly, the region 700 includes regions 701 and 702 arranged in the x direction. Ones of the transistors 161 and 166 constituting the pull-down driver circuits are collectively arranged in the region 701 and the others of the transistors 161 and 166 constituting the pull-down driver circuits are collectively arranged in the region 702.

Signs 411H/L to 414H/L, 421H/L to 424H/L, 4311/L to 434H/L, and 441H/L to 444H/L shown in FIG. 15 denote regions where the driver circuits shown in FIGS. 9 and 11 are located. Driver circuits included in the high-speed path and driver circuits included in the low-speed path are arranged adjacently in the x direction. For example, the driver circuit 411L and the driver circuit 411H are arranged adjacently in the x direction. Outputs of these driver circuits are used to control common output transistors (not shown). The driver circuit 421H included in the high-speed path is located on the opposite side to the driver circuit 411L with respect to the driver circuit 411H. Driver circuits larger in the size are located nearer the region 600. Similarly, signs 511H/L to 514H/L, 521H/L to 524H/L, 531H/L to 534H/L, and 541H/L to 544H/L shown in FIG. 15 denote regions where the driver circuits shown in FIGS. 10 and 12 are located. Driver circuits included in the high-speed path and driver circuits included in the low-speed path are arranged adjacently in the x direction. For example, the driver circuit 511L and the driver circuit 511H are arranged adjacently in the x direction. The driver circuit 521H included in the high-speed path is located on the opposite side to the driver circuit 511L with respect to the driver circuit 511H. Driver circuits larger in the size are located nearer the region 700. The layout of circuits arranged in the regions 400 and 600 and the layout of circuits arranged in the regions 500 and 700 are symmetric with respect to a straight line Ly extending in the y direction. The speed selectors 41H/L to 44H/L and the speed selectors 5H/L to 54H/L are also arranged symmetrically with respect to the straight line Ly.

Figure 16:
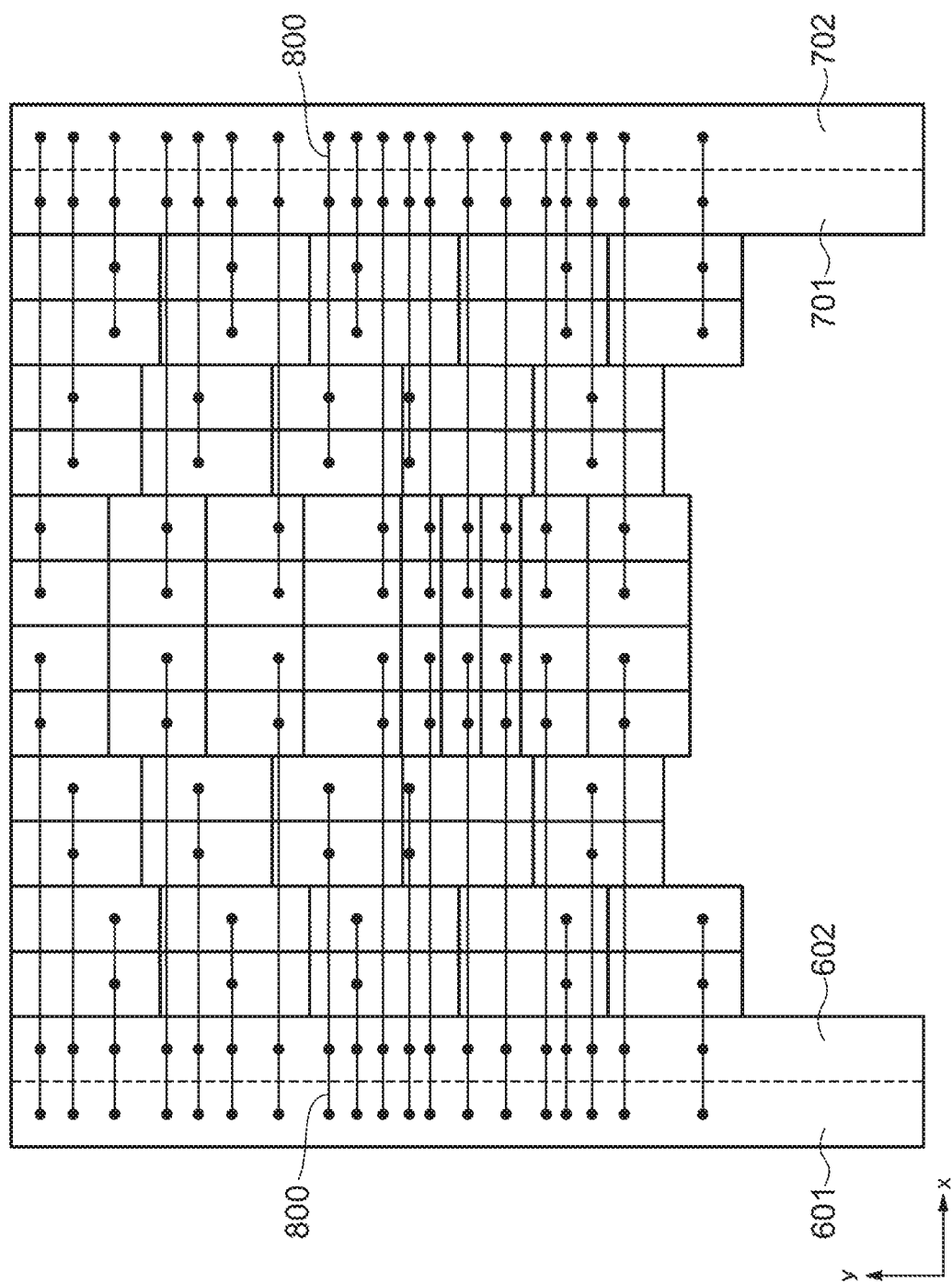
FIG. 16 is a diagram showing power supply lines formed on the driver circuit.

As shown in FIG. 16, the driver circuits 411H/L to 44H/L, 421H/L to 424H/L, 431H/L to 434H/L, and 441H/L to 444H/L arranged in the region 400 are connected to the transistors 161 and 166 arranged in the region 600 via power supply lines 800 extending in the x direction. Similarly, the driver circuits 511H/L to 514H/L, 521H/L to 524H/L, 531H/L to 534H/L, and 541H/L to 544H/L arranged in the region 500 are connected to the transistors 161 and 166 arranged in the region 700 via the power supply lines 800 extending in the x direction. In this way, according to the present invention, the transistors 161 and 166 functioning as power supply switches are collectively arranged in the regions 600 and 700 and other transistors are collectively arranged in the regions 400 and 500 sandwiched by the regions 60 and 700. If the transistors functioning as switches are dispersedly arranged in the corresponding driver circuits, the sizes of the driver circuits are increased in at least one of the x direction and the y direction and the paths of data signal lines are correspondingly elongated. With the layout of the transistors collectively arranged as described above, the paths of the data signal lines are shortened, which contributes to a high-speed operation of the circuits.

Figure 17:
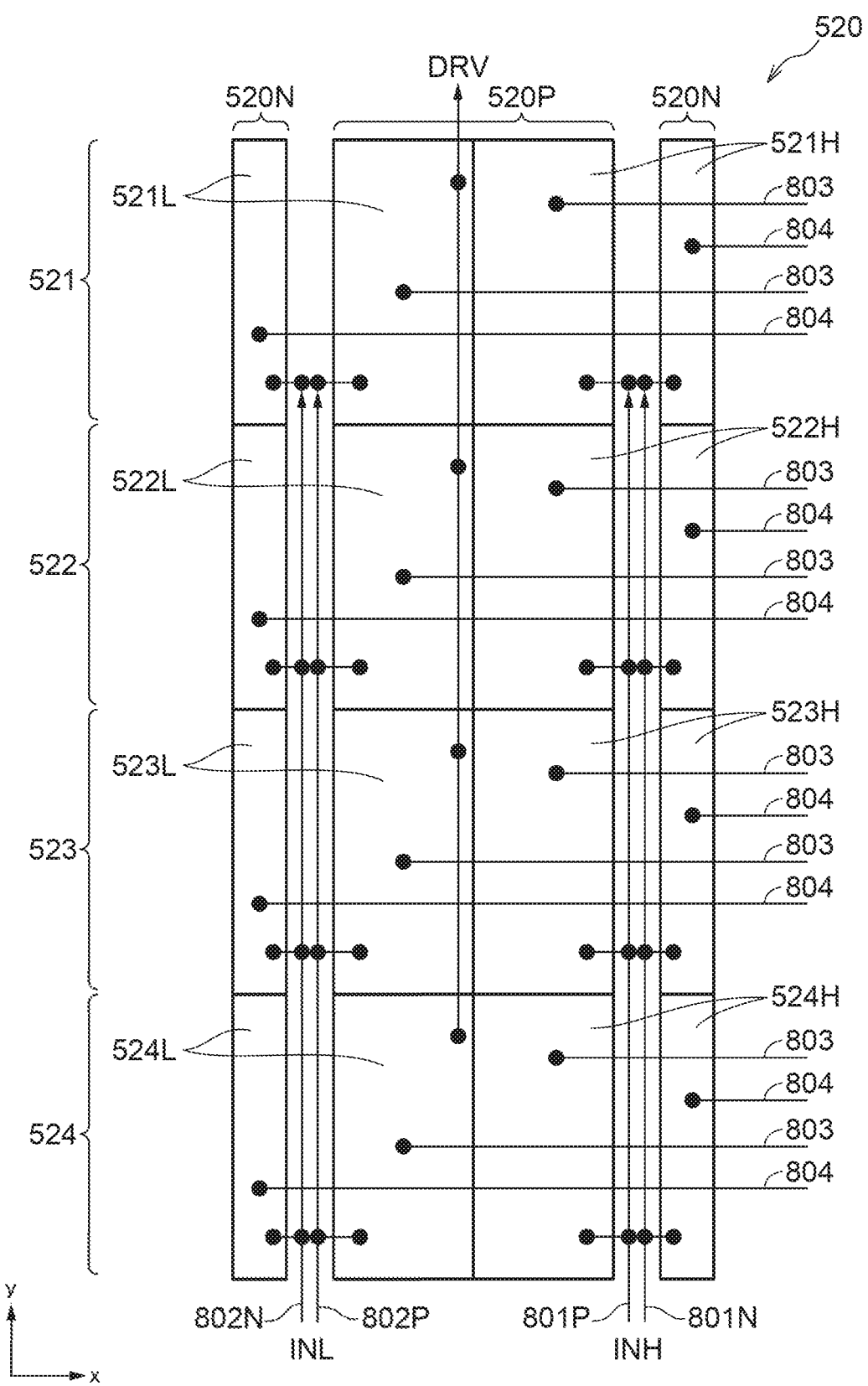
FIG. 17 is a diagram showing a layout of the driver circuit in more detail.

FIG. 17 is a diagram showing the layout of a region 520 shown in FIG. 15 in more detail. As shown in FIG. 17, a block 521 including the driver circuits 521H and 521L, a block 522 including the driver circuits 522H and 522L, a block 523 including the driver circuits 523H and 523L, and a block 524 including the driver circuits 524H and 524L are arranged in the region 520. These blocks 521 to 524 are arranged in the y direction. The region 520 has a region 520P where the P-channel MOS transistors 162 and 163 shown in FIG. 14 are arranged, and regions 520N where the N-channel MOS transistors 164 and 165 shown in FIG. 14 are arranged. The region 520P is shared by the driver circuits 521H to 524H and the driver circuits 521L to 524L. A data signal INH is input to the driver circuits 521H to 524H via signal lines 801P and 801N extending in the y direction along a boundary between the region 520P and the region 520N, and a data signal INL is input to the driver circuits 521L to 524L via signal lines 802P and 802N extending in the y direction along a boundary between the region 520P and the region 520N. Accordingly, the signal lines 801P and 801N crossover power supply lines 803 that supply a power potential to the P-channel MOS transistors 162 and 163 located in the region 520P, and cross over power supply lines 804 that supply a power potential to the N-channel MOS transistors 164 and 165 of the driver circuits 521H to 524H located in the region 520N. Meanwhile, the signal lines 802P and 802N do not cross over the power supply lines 803 while crossing over the power supply lines 804.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or subcombination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. An apparatus comprising:
a first buffer circuit;
a plurality of first driver circuits configured to drive the first buffer circuit; and
a plurality of first switch circuits configured to supply an operation voltage to the first driver circuits, respectively,
wherein the first driver circuits are collectively arranged in a first region in a matrix, and
wherein the first switch circuits are collectively arranged in a second region different from the first region.
2. The apparatus of claim 1, wherein the second region is adjacent to the first region.
3. The apparatus of claim 2, wherein each of the first switch circuits includes a first transistor configured to supply a first potential to an associated one of the first driver circuits, and a second transistor configured to supply a second potential to the associated one of the first driver circuits.

4. The apparatus of claim 3,
wherein the second region includes a first sub-region and a second sub-region,
wherein the first transistors are collectively arranged in the first sub-region, and
wherein the second transistors are collectively arranged in the second sub-region.

5. The apparatus of claim 4, further comprising:
a second buffer circuit;
a plurality of second driver circuits configured to drive the second buffer circuit; and
a plurality of second switch circuits configured to supply an operation voltage to the second driver circuits, respectively,
wherein the second driver circuits are collectively arranged in a third region in a matrix, and
wherein the second switch circuits are collectively arranged in a fourth region different from the third region.

6. The apparatus of claim 5, wherein the fourth region is adjacent to the third region.

7. The apparatus of claim 6, wherein the first region is adjacent to the third region.

8. The apparatus of claim 7, wherein the first and third regions are arranged between the second and fourth regions.

9. The apparatus of claim 8, wherein each of the second switch circuits includes a third transistor configured to supply the first potential to an associated one of the second driver circuits, and a fourth transistor configured to supply the second potential to the associated one of the second driver circuits.

10. The apparatus of claim 9,
wherein the fourth region includes a third sub-region and a fourth sub-region,
wherein the third transistors are collectively arranged in the third sub-region, and
wherein the fourth transistors are collectively arranged in the fourth sub-region.

11. The apparatus of claim 10, further comprising an external terminal electrode,
wherein the first and second buffer circuits are connected to the external terminal electrode in common.

12. The apparatus of claim 11, wherein the first and second buffer circuits are configured to be exclusively activated.

13. An apparatus comprising:
an external terminal electrode;
a first buffer circuit connected between a first power supply line and the external terminal electrode;
a second buffer circuit connected between a second power supply line and the external terminal electrode;
a first driver circuit configured to drive the first buffer circuit;
a second driver circuit configured to drive the second buffer circuit;
a first switch circuit configured to supply an operation voltage to the first driver circuit; and
a second switch circuit configured to supply an operation voltage to the second driver circuit,
wherein the first and second driver circuits are arranged between the first and second switch circuits.

14. The apparatus of claim 13,
wherein the first driver circuit includes first and second transistors connected in series between third and fourth power supply lines,
wherein the second driver circuit includes third and fourth transistors connected in series between the third and fourth power supply lines,
wherein the first buffer circuit has an input node connected to a first connection node between the first and second transistors, and
wherein the second buffer circuit has an input node connected to a second connection node between the third and fourth transistors.

15. The apparatus of claim 14,
wherein the first switch circuit includes a fifth transistor connected between the third power supply line and the first connection node, and
wherein the second switch circuit includes a sixth transistor connected between the third power supply line and the second connection node.

16. The apparatus of claim 15,
wherein the first switch circuit further includes a seventh transistor connected between the fourth power supply line and the first connection node, and
wherein the second switch circuit further includes an eighth transistor connected between the fourth power supply line and the second connection node.

* * * * *